（12) United States Patent
Okada

(10) Patent No.: US 9,607,830 B2
(45) Date of Patent: Mar. 28, 2017

(54) METHOD OF FORMING GERMANIUM FILM AND APPARATUS THEREFOR

(71) Applicant: TOKYO ELECTRON LIMITED, Tokyo (JP)

(72) Inventor: Mitsuhiro Okada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/816,584

(22) Filed: Aug. 3, 2015

(65) Prior Publication Data

US 2016/0049298 A1 Feb. 18, 2016

(30) Foreign Application Priority Data

Aug. 12, 2014 (JP) .................... 2014-164183

(51) Int. Cl.
| H01L 21/00 | (2006.01) |
| H01L 21/02 | (2006.01) |
| C23C 16/455 | (2006.01) |
| C23C 16/52 | (2006.01) |

(52) U.S. Cl.
CPC .. *H01L 21/02532* (2013.01); *C23C 16/45578* (2013.01); *C23C 16/52* (2013.01); *H01L 21/0245* (2013.01); *H01L 21/0262* (2013.01); *H01L 21/02488* (2013.01); *H01L 21/02505* (2013.01)

(58) Field of Classification Search
CPC ........... H01L 21/02532; H01L 21/0262; H01L 21/0245; H01L 21/02488; H01L 21/02505
See application file for complete search history.

(56) References Cited

U.S. PATENT DOCUMENTS

2013/0084693 A1* 4/2013 Kakimoto ............... C23C 16/24
438/482

FOREIGN PATENT DOCUMENTS

| JP | 2008-004935 A | 1/2008 |
| JP | 2008-501226 A | 1/2008 |
| JP | 2008-071814 A | 3/2008 |
| JP | 2010-034580 A | 2/2010 |
| JP | 2013-181231 A | 9/2013 |

* cited by examiner

*Primary Examiner* — Richard Booth
(74) *Attorney, Agent, or Firm* — Nath, Goldberg & Meyer; Jerald L. Meyer

(57) ABSTRACT

There is provided a method of forming a germanium (Ge) film on a surface of a target object, which includes: supplying an aminosilane-based gas into a processing chamber in which the target object is loaded; supplying a high-order silane-based gas of disilane or higher into the processing chamber; and supplying a Ge source gas into the processing chamber. A process temperature in supplying the Ge source gas is set to fall within a range from a temperature, at which the Ge source gas is thermally decomposed or higher, to 300 degrees C. or less.

14 Claims, 20 Drawing Sheets

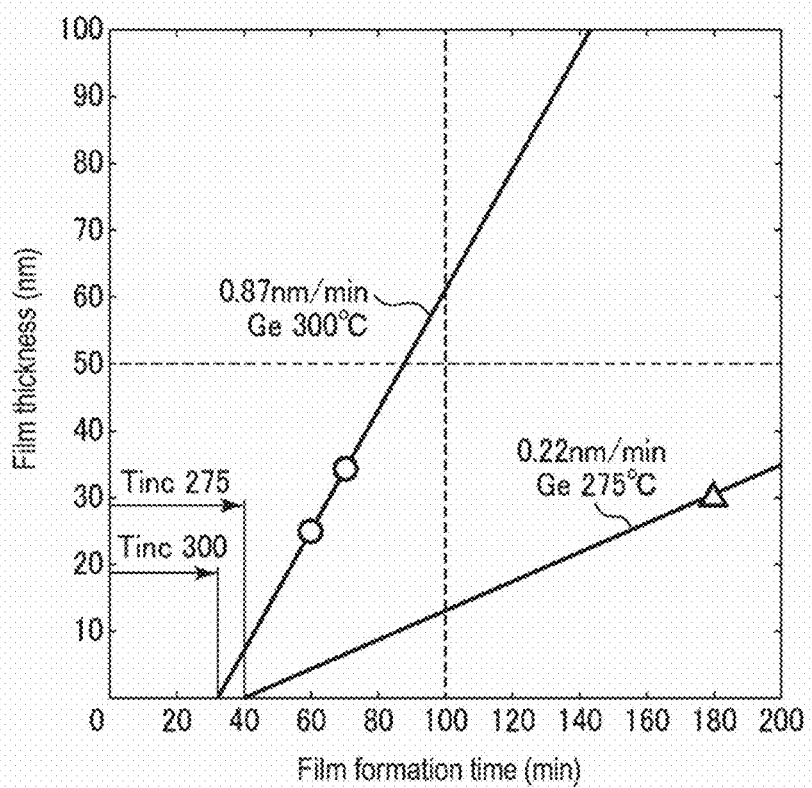

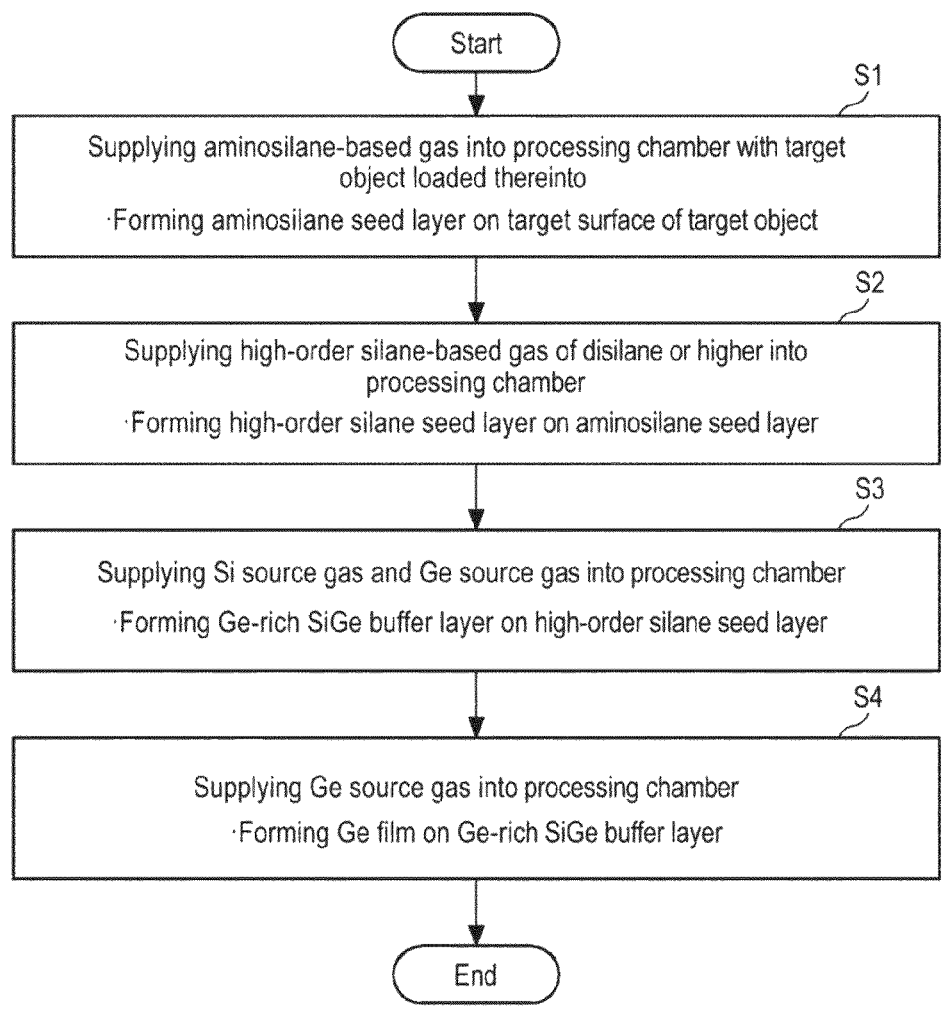

Film formation temperature : 300°C, Underlayer : Si

Film formation temperature : 275°C, Underlayer : Si

Film formation temperature : 300°C, Underlayer : SiGe(Si:Ge=30%:70%)

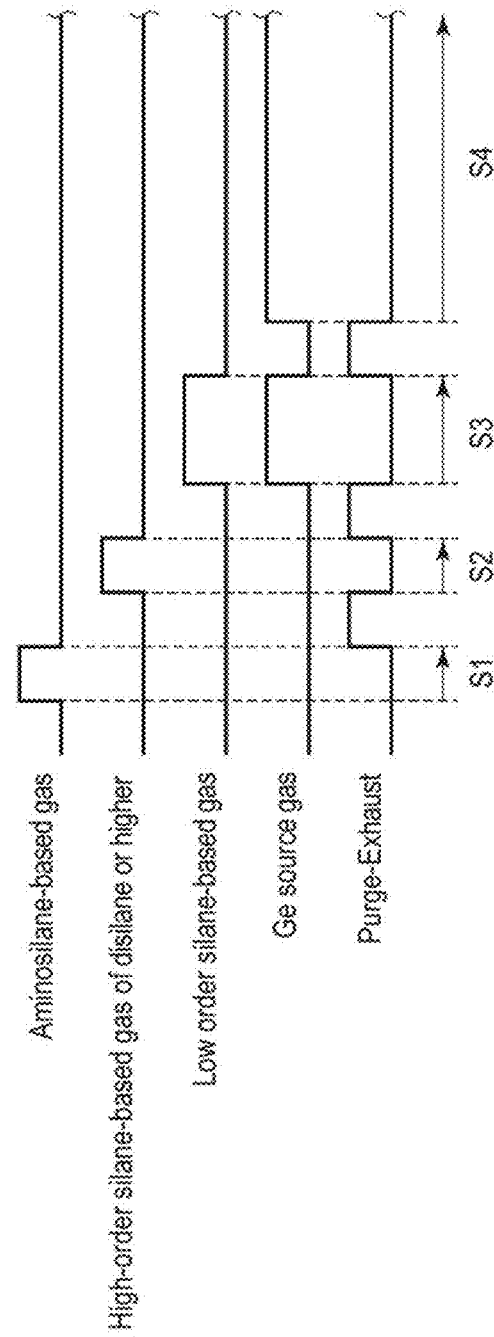

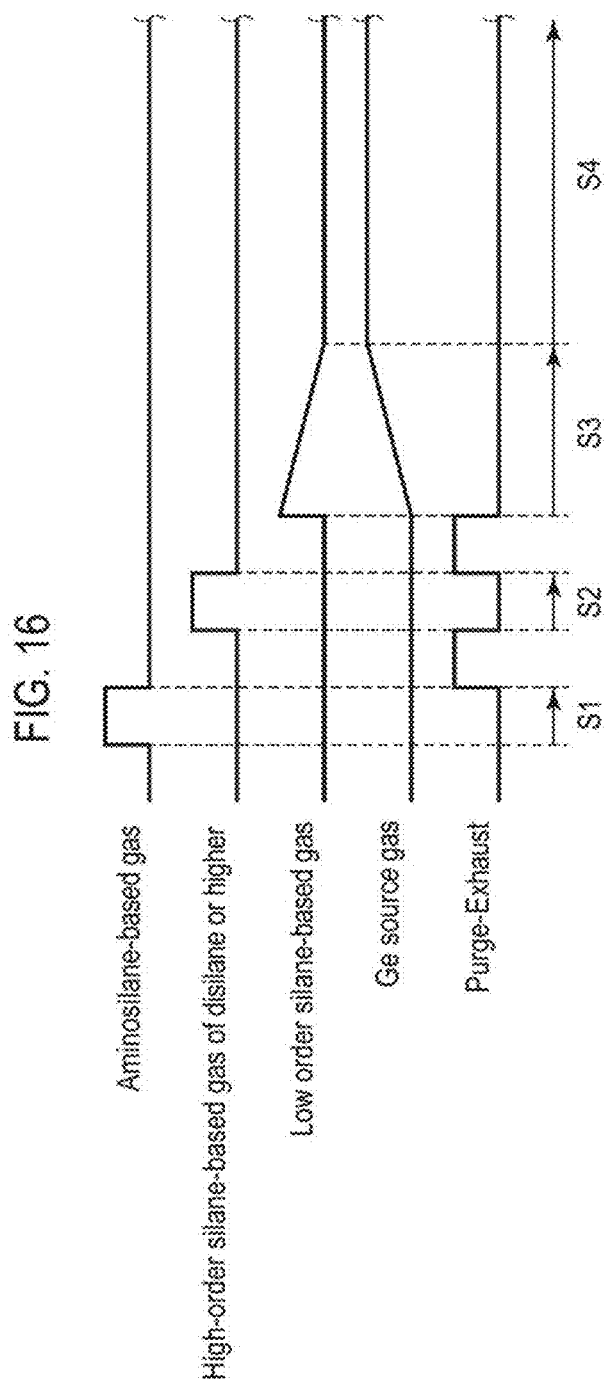

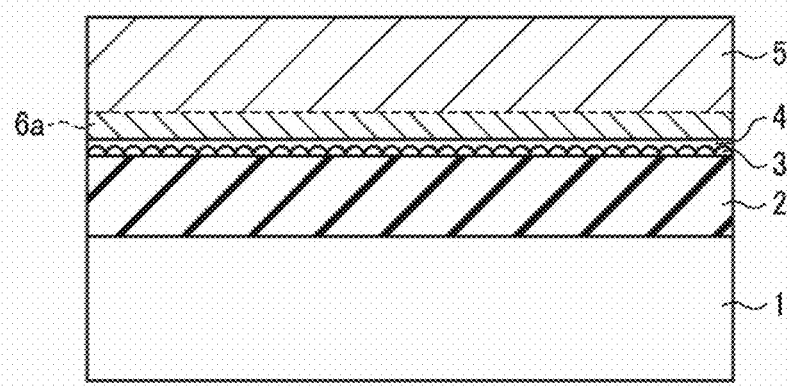

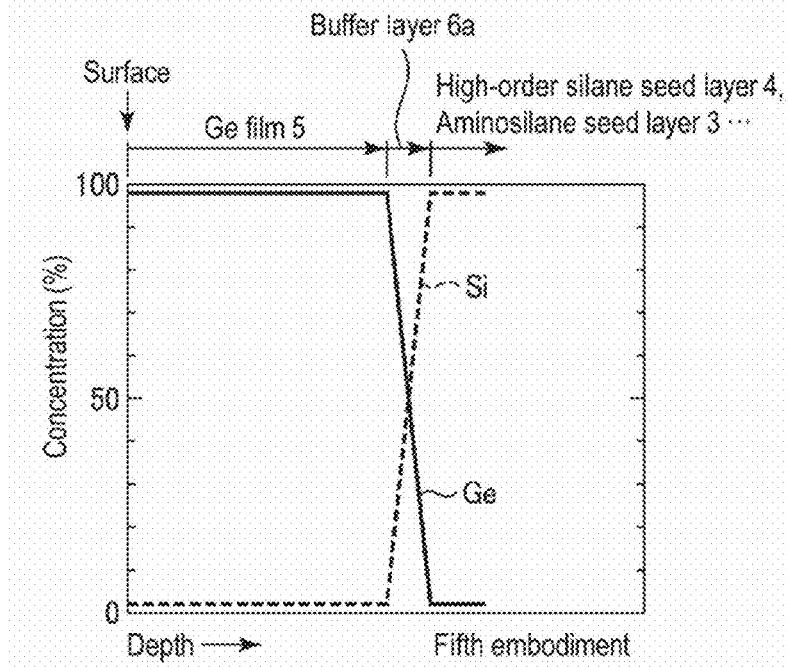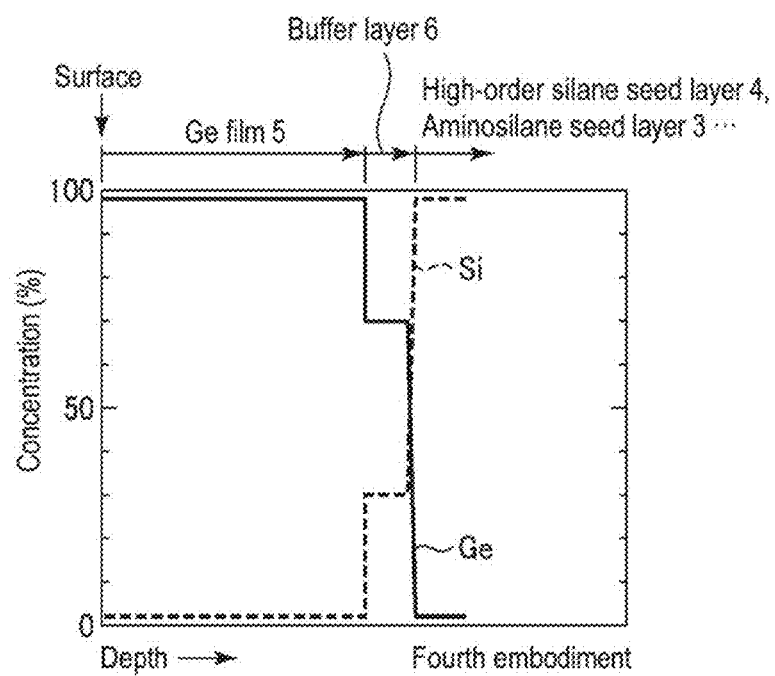

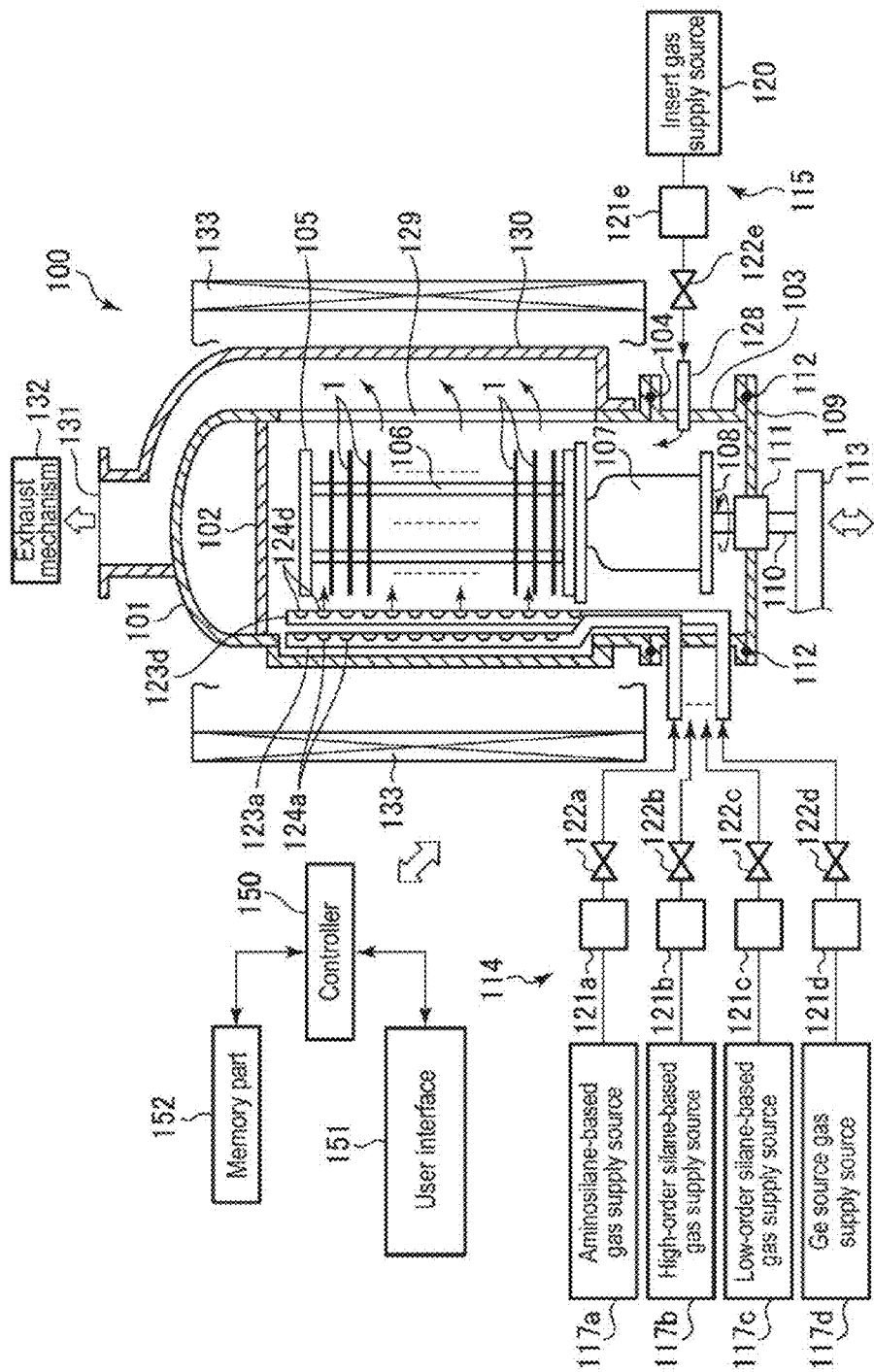

METHOD OF FORMING GERMANIUM FILM AND APPARATUS THEREFOR

CROSS-REFERENCE TO RELATED APPLICATION

This application claims the benefit of Japanese Patent Application No. 2014-164183, filed on Aug. 12, 2014, in the Japan Patent Office, the disclosure of which is incorporated herein in its entirety by reference.

TECHNICAL FIELD

The present disclosure relates to a method of forming a germanium (Ge) film and an apparatus therefore.

BACKGROUND

Recently, a high-speed operation of a semiconductor integrated circuit device is in demand. Such a high-speed operation mainly requires a reduction in size of a semiconductor device such as a transistor, a reduction in resistance of a wiring, and a reduction in dielectric constant of an interlayer dielectric layer. However, the high-speed operation based on such approaches has limitations.

As such, "improvement of a carrier mobility of a channel" is under consideration as a way to realize a high-speed operation. A semiconductor used in the semiconductor integrated circuit device mainly includes silicon (Si). A channel of a transistor is substituted with a semiconductor material having a higher carrier mobility than Si. Silicon germanium (SiGe) or germanium (Ge) is getting a lot of attention as a material of the channel.

For example, Si has an electron mobility $(\mu n) \approx 1450$ to 1600 $(cm^2/V \cdot s)$ while Ge has an electron mobility $(\mu n) \approx 3900$ $(cm^2/V \cdot s)$. In addition, Si has a hole mobility $(\mu p) \approx 430$ to 505 $(cm^2/V \cdot s)$ while Ge has a hole mobility $(\mu p) \approx 1900$ $(cm^2/V \cdot s)$.

As described above, Ge has higher electron mobility and hole mobility than Si. For this reason, Ge or Ge-rich SiGe which contains Ge of a high concentration is promising as a next-generation channel material.

One of primary endpoints for the channel material includes a surface roughness. When a surface roughness of the channel material does not fall within an allowable range, even if the material has a good carrier mobility, scattering of carriers is generated due to irregularities of a surface of the material. Thus, such a material may not be sufficient to use as the channel material.

Further, the miniaturization of the semiconductor integrated circuit device has been prompted. As such, even if a surface roughness on the order of micrometer (μm) is sufficiently allowable, such a surface roughness is still too rough, thus failing to meet the order of nanometer (nm). The level of a surface roughness of Ge or Ge-rich SiGe film in the existing miniaturized semiconductor integrated circuit device fails to satisfy the needs of a maker. That is to say, Ge or Ge-rich SiGe film on the order of nanometer (nm) is hard to be formed on an underlayer such as $SiO_2$, SiN, C, metal or the like, with a goof surface roughness.

SUMMARY

Some embodiments of the present disclosure provide a method of forming a germanium (Ge) film, which is capable of forming a Ge-rich SiGe film containing Ge of a high concentration or Ge film on a surface of a target object with a good surface roughness, and a film forming apparatus capable of performing the Ge film forming method.

According to one embodiment of the present disclosure, there is provided a method of forming a germanium (Ge) film on a surface of a target object, including: supplying an aminosilane-based gas into a processing chamber in which the target object is loaded; supplying a high-order silane-based gas of disilane or higher into the processing chamber; and supplying a Ge source gas into the processing chamber, wherein a process temperature in supplying the Ge source gas is set to fall within a range from a temperature, at which the Ge source gas is thermally decomposed or higher, to 300 degrees C. or less.

According to another embodiment of the present disclosure, there is provided a method of forming a Germanium (Ge) film on a surface of a target object, including: supplying an aminosilane-based gas into a processing chamber in which the target object is loaded; supplying a high-order silane-based gas of disilane or higher into the processing chamber; supplying a silicon (Si) source gas and a Ge source gas into the processing chamber; and supplying the Ge source gas into the processing chamber.

According to another embodiment of the present disclosure, there is provided an apparatus of forming a germanium (Ge) film on a surface of a target object, including: a processing chamber configured to accommodate the target object, a gas supply mechanism configured to supply an aminosilane-based gas, a high-order silane-based gas of disilane or higher, a silicon (Si) source gas and a Ge source gas into the processing chamber, a heating device configured to heat an inside of the processing chamber, an exhaust device configured to exhaust the inside of the processing chamber, and a controller configured to control the gas supply mechanism, the heating device, and the exhaust device, wherein the controller controls the gas supply mechanism, the heating device and the exhaust device such that the aforementioned method is performed on the target object within the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view showing a relationship between a film formation time and a film thickness when a film formation temperature of the Ge film is 300 degrees C. and 275 degrees C.

FIG. 9 is a flowchart showing a sequence of an example of a Ge film forming method according to a fourth embodiment of the present disclosure.

FIG. 15 is a timing chart showing a sequence of timings at which the supply of gas and a purge-exhaust operation are performed in the example of the Ge film forming method according to the third embodiment of the present disclosure.

FIG. 16 is a timing chart showing a sequence of timings at which the supply of gas and a purge-exhaust operation are performed in an example of a Ge film forming method according to another embodiment of the present disclosure.

FIG. 17 is a cross-sectional view of a wafer including a Ge film which is formed by a Ge film forming method according to a fifth embodiment of the present disclosure.

FIG. 18A is a view showing a concentration profile in a depth direction of the wafer which includes the Ge film formed by the Ge film forming method according to the fifth embodiment of the present disclosure.

FIG. 18B is a view showing a concentration profile in a depth direction of the wafer which includes the Ge film formed by the Ge film forming method according to the third embodiment of the present disclosure.

FIG. 19 is a cross-sectional view schematically showing an example of a film forming apparatus according to a sixth embodiment of the present disclosure, which is capable of performing the Ge film forming method.

DETAILED DESCRIPTION

Figure 1:
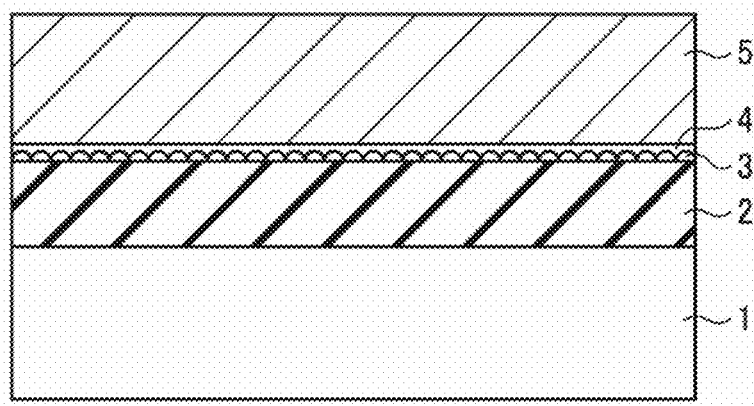
FIG. 1 is a cross-sectional view of a target object which includes a Ge film formed by a Ge film forming method according to a first embodiment of the present disclosure.

Reference will now be made in detail to various embodiments, examples of which are shown in the accompanying drawings. In the drawings, like reference numerals denote like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Film Forming Method

FIG. 1 is a cross-sectional view of a target object which includes a germanium (Ge) film formed by a germanium film forming method according to a first embodiment of the present disclosure.

As shown in FIG. 1, a silicon oxide film 2 (hereinafter, referred to as a "$SiO_2$ film") is formed on the target object, e.g., a silicon wafer 1 (hereinafter, simply referred to as a "wafer"). In this embodiment, the $SiO_2$ film 2 serves as a base (i.e., a surface to be processed) on which a germanium film (hereinafter, referred to as a "Ge film") is formed. An aminosilane seed layer 3 followed by a high-order silane seed layer 4 are formed on the $SiO_2$ film 2. The aminosilane seed layer 3 is formed by an aminosilane-based gas, and the high-order silane seed layer 4 is formed by a high-order silane-based gas of disilane or higher. A Ge film 5 is formed on the high-order silane seed layer 4. In this embodiment, the Ge film 5 is a Ge-rich SiGe film in which the concentration of Ge is, e.g., over 70%, or a substantial Ge film in which the concentration of Ge is almost 100%.

The following is a description on the method of forming the Ge film 5 according to the first embodiment. First, for example, the wafer 1 with the $SiO_2$ film 2 formed thereon is loaded into a processing chamber of a film forming apparatus (which will be described later).

Subsequently, the aminosilane-based gas is supplied into the processing chamber into which the wafer 1 is loaded. Then, the aminosilane-based gas is adsorbed onto the surface of the wafer 1 (the $SiO_2$ film 2, in this embodiment), thus forming the aminosilane seed layer 3.

Thereafter, the high-order silane-based gas of disilane or higher is supplied into the processing chamber. Then, the high-order silane seed layer 4 having a shape of a thin layer is formed on the aminosilane seed layer 3.

Subsequently, a combination of a Ge source gas and a Si source gas, or the Ge source gas alone is supplied into the processing chamber such that the Ge film 5 is formed on the high-order silane seed layer 4.

Figure 2:
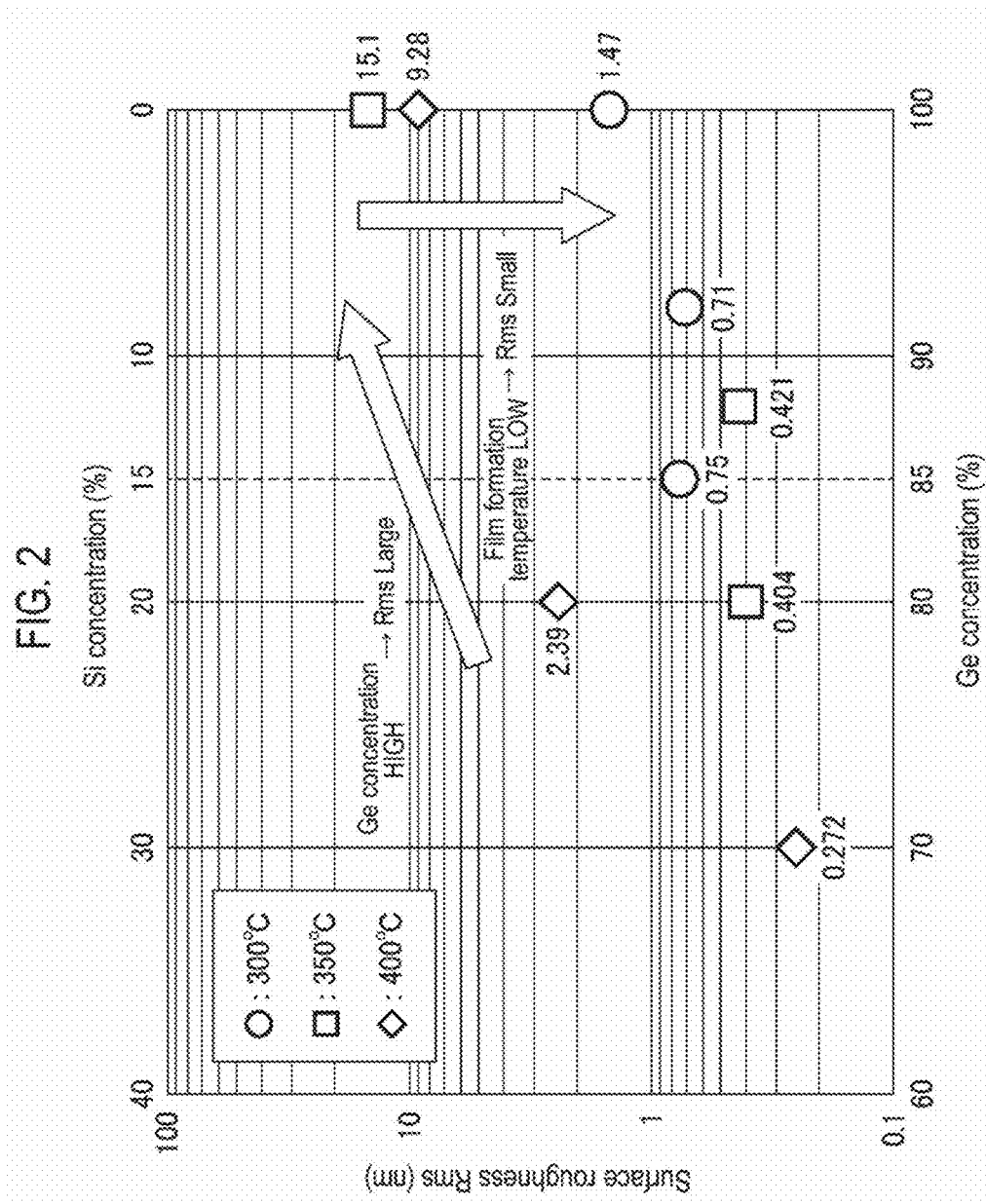
FIGS. 2 to 4 are views showing a relationship between a Ge concentration of the Ge film and a surface roughness Rms at every film formation temperature of the Ge film, respectively.

FIG. 2 is a view showing a relationship between a Ge concentration of the Ge film 5 and a surface roughness Rms at every film formation temperature of the Ge film 5. Wherein, the expression "Rms" represents a square average roughness.

As can be seen from FIG. 2, the surface roughness Rms of the Ge film 5 tends to increase as the Ge concentration of the Ge film 5 increases. For example, at the film formation temperature of 400 degrees C., when the Ge concentration of the Ge film 5 is 70% or less, the Ge film 5 has a relatively small surface roughness on the order of Rms=0.272 nm, which results in a good flatness.

However, the level of the surface roughness Rms is increased as the Ge concentration exceeds 70% and becomes close to 100%, which degrades the flatness of the Ge film 5. Such a tendency is manifested at all the film formation temperatures of 400 degrees C., 350 degrees C., and 300 degrees C.

In this embodiment, the Ge film 5 has small surface irregularities as far as possible and the Ge concentration of over 70% (in some embodiments, a range from 80% to 100%) so as to use as a channel material.

Further, as shown in FIG. 2, the surface roughness Rms tends to be decreased with a decrease in the film formation temperature of the Ge film 5. The reason for this is as follows. When the film formation temperature of the Ge film 5 is relatively high, a crystallization of Ge promoted in a film forming process so that many great crystal grains are grown. Orientations of the crystal grains are different, thus generating irregularities on the surface of the Ge film 5, which results in an increased surface roughness.

Meanwhile, the film formation temperature of the Ge film 5 is set at a relatively low level such that the crystallization of Ge in the formed Ge film is suppressed. This makes the great crystals hard to be formed. Thus, it is assumed that irregularities to be formed on the surface of the Ge film 5 are decreased.

Based on such knowledge, according to the Ge film forming method of the first embodiment, the film formation temperature of the Ge film 5 is set to fall within a range from a temperature or higher at which the Ge source gas is thermally decomposed to 300 degrees C. or less. Thus, it is possible to form the Ge-rich SiGe film 5 in which Ge is contained at a high concentration of, e.g., over 70% (in some embodiments, 80% or higher), or the substantial Ge film 5, on the base with a good flatness.

Second Embodiment

As described above, in the first embodiment, the film formation temperature of the Ge film 5 is set to fall within the range from a temperature or higher at which the Ge source gas is thermally decomposed to 300 degrees C. or less. Thus, it is possible to obtain the Ge film 5 having a good flatness which corresponds to the surface roughness Rms=1.47 nm or less, even if the Ge concentration is almost 100%.

In the existing semiconductor integrated circuit device, a Ge film having the surface roughness Rms=1.47 nm may be allowed. However, in consideration of reducing a size of the semiconductor integrated circuit device in the future, for example, the substantial Ge film having the Ge concentration of almost 100% may be required to have a surface roughness Rms=1 nm or less.

A second embodiment is provided to support such requirement. In the second embodiment, the film formation temperature of the Ge film 5 is lowered from 300 degrees C. to 275 degrees C. so as to further improve the surface roughness Rms. The results are shown in FIG. 3.

Figure 3:
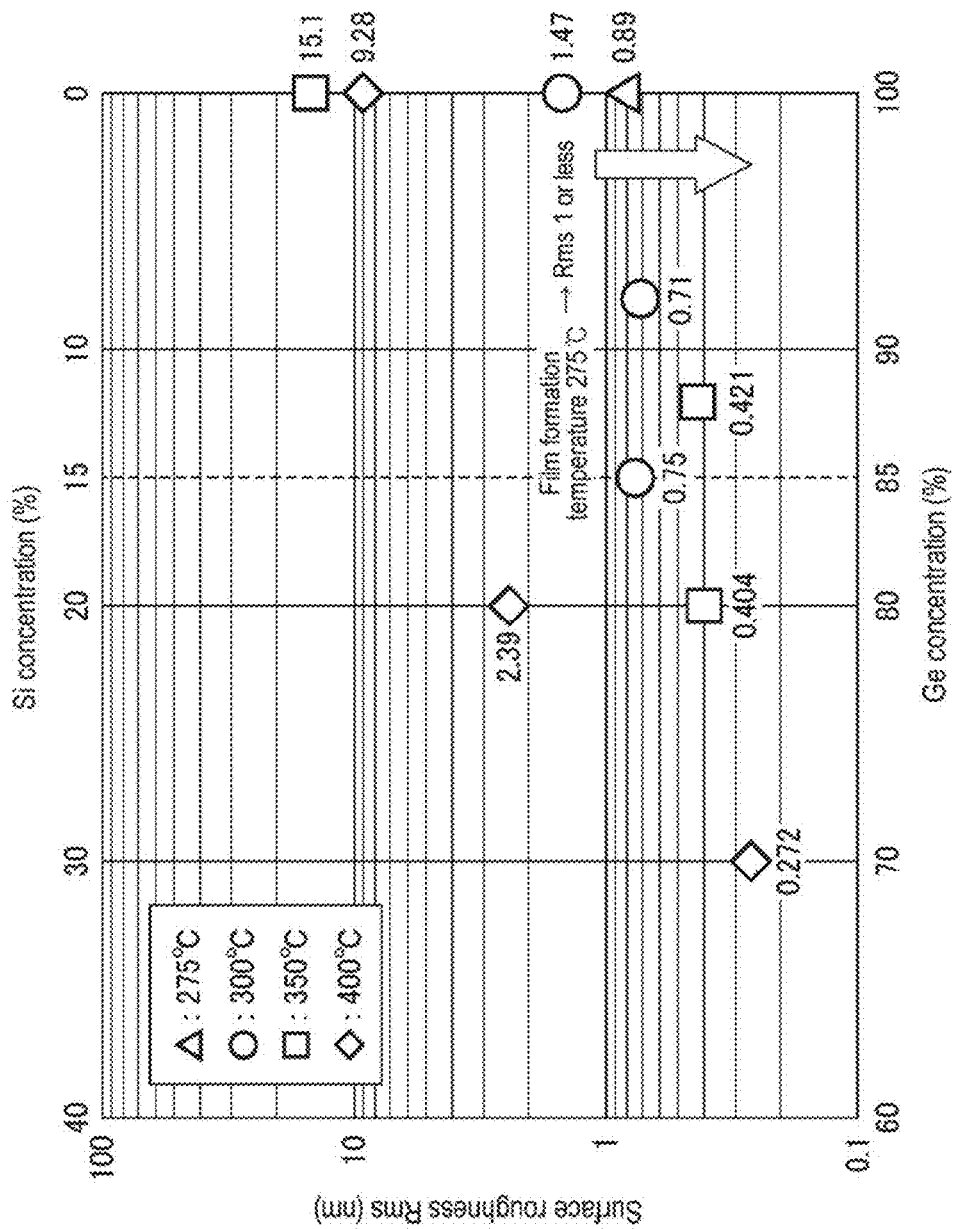

FIG. 3 is a view showing a relationship between a Ge concentration of the Ge film 5 and a surface roughness Rms at every film formation temperature of the Ge film 5.

As shown in FIG. 3, the surface roughness Rms was reduced up to 0.89 nm by lowering the film formation temperature of the Ge film 5 (which has a Ge concentration of 100% in this embodiment) to 275 degrees C.

As described above, by further lowering the film formation temperature of the Ge film 5 to a temperature or higher at which the Ge source gas is thermally decomposed to 275 degrees C. or less, it is possible to obtain the Ge film 5 having better flatness corresponding to the surface roughness Rms of 1 nm or less, even if the Ge film 5 has the Ge concentration of almost 100%.

Third Embodiment

Figure 4:
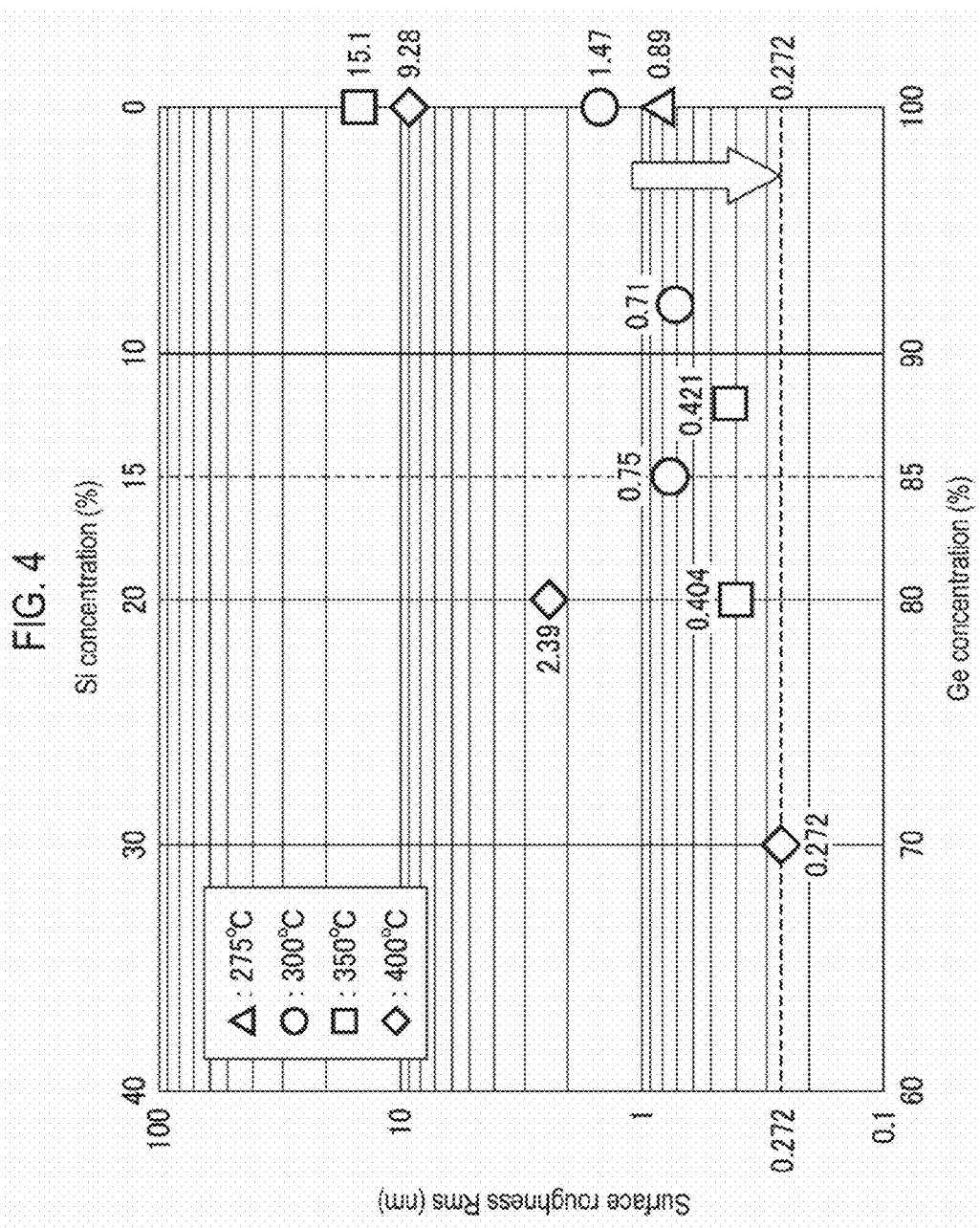

FIG. 4 is a view showing a relationship between a Ge concentration of the Ge film 5 and a surface roughness Rms at every film formation temperature of the Ge film 5.

In the second embodiment, the film formation temperature of the Ge film 5 is set to be further lowered compared to the first embodiment, thus obtaining the Ge film 5 having better flatness which corresponds to the surface roughness Rms of 1 nm or less (e.g., 0.89 nm), even if the Ge film 5 has the Ge concentration of almost 100%.

The third embodiment is provided to obtain the Ge film 5 having a further reduced surface roughness Rms. As shown in FIG. 4, in the third embodiment, the Ge film 5 has the surface roughness Rms=almost 0.272 nm or lower, which is obtained at the film formation temperature of 400 degrees C. and in the Ge concentration of 70%.

The present inventors have been examining physical properties of respective Ge films when the film formation temperatures are 300 degrees C. and 275 degrees C. The inventors realized that the further reduced surface roughness cannot be achieved merely by setting the film formation temperature as described above. For the sake of simplicity, a Ge film formed when the film formation temperatures is 300 degrees C. will be simply referred to as to a "Ge film-300 degrees C.", and a Ge film formed when the film formation temperature is 275 degrees C. will be simply referred to as to a "Ge film-275 degrees C."

Figure 5:
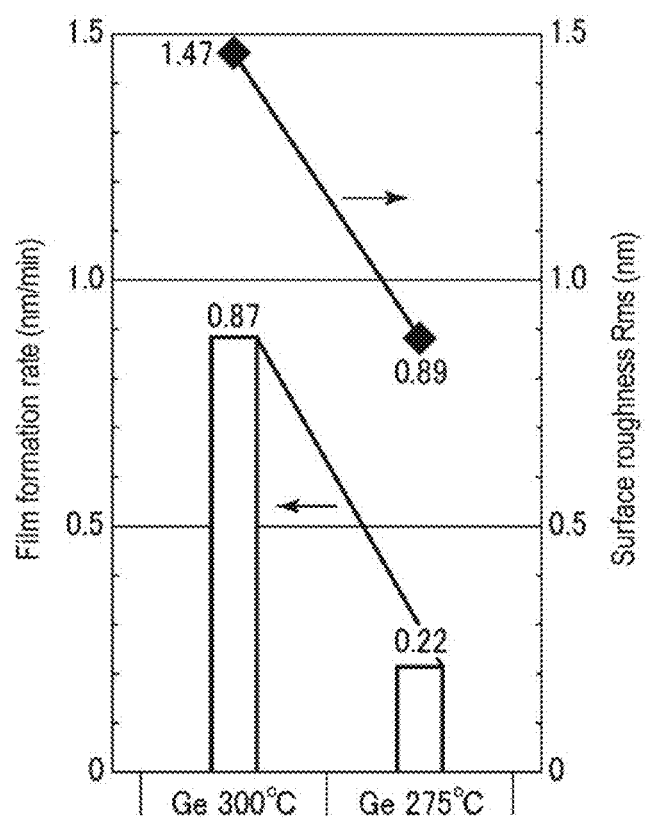
FIG. 5 is a view showing a relationship between a film formation rate and a surface roughness Rms when a film formation temperature of a Ge film is 300 degrees C. and 275 degrees C.

FIG. 5 is a view showing a relationship between a film formation rate and a surface roughness Rms in each of the Ge film-300 degrees C. and the Ge film-275 degrees C. FIG. 6 is a view showing a relationship between a film formation time and a film thickness in each of the Ge film-300 degrees C. and the Ge film-275 degrees C.

As shown in FIG. 5, a film formation rate of the Ge film-300 degrees C. on the Si film is 0.87 nm/min, while a film formation rate of the Ge film-275 degrees C. on the Si film is 0.22 nm/min. As indicated by a symbol ♦ in FIG. 5, the Ge film-300 degrees C. and the Ge film-275 degrees C. have surface roughness Rms of 1.47 nm and 0.89, respectively.

Further, as shown in FIG. 6, the film thickness of the Ge film-300 degrees C. was about 25 nm at the film formation time of about 60 minutes, and was about 34 nm at the film formation time of about 70 minutes. At this time, the film formation rate was 0.87 nm/min, as shown in FIG. 5. Likewise, the film thickness of the Ge film-275 degrees C. was about 30 nm at the film formation time of about 180 minutes. In FIG. 6, the film thickness of the Ge film-275 degrees C. is indicated by plotting only one point at about 180 minutes. At this time, the film formation rate was 0.22 nm/min, as shown in FIG. 5.

From the results of FIG. 6, it is assumed that an incubation time Tinc 300 of the Ge film-300 degrees C. is about 33 minutes and an incubation time Tinc 275 of the Ge film-275 degrees C. is about 40 minutes.

The improvement of the surface roughness of the Ge film 5 requires reducing the incubation time Tinc. As an example, assuming that the incubation time Tinc 300 of the Ge film-300 degrees C. is less than about 33 minutes, the surface roughness Rms of the Ge film-300 degrees C. may be a level of below 1.47 nm. Similarly, assuming that the incubation time "Tinc 275" of the Ge film-275 degrees C. is less than about 40 minutes, the surface roughness Rms of the Ge film-275 degrees C. may be a level of below 0.89 nm. These assumptions are based on the following mechanism.

FIGS. 7A to 7E are views schematically showing the growth of nuclei when the incubation time Tinc is relatively long. FIGS. 8A to 8C are views schematically showing the growth of nuclei when the incubation time Tinc is relatively short.

<For Relatively Long Incubation Time>

Figure 7A:
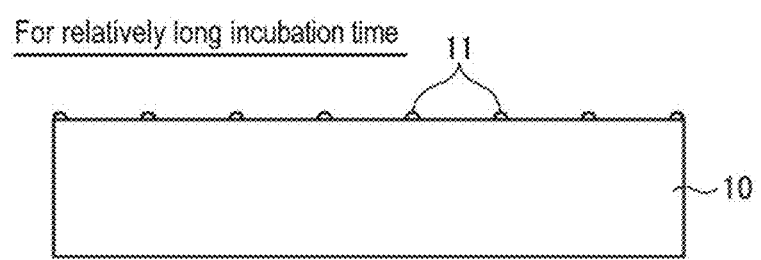
FIGS. 7A to 7E are views schematically showing the growth of nuclei when an incubation time Tinc is long, respectively.
Figure 8A:
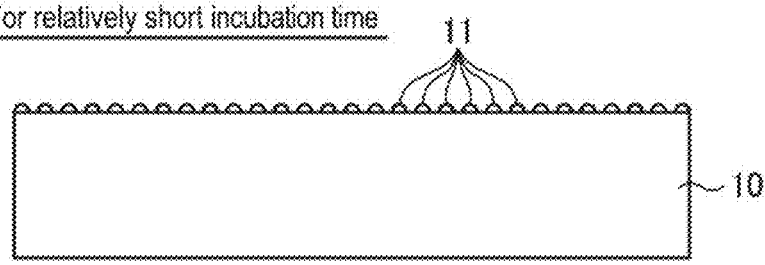
FIGS. 8A to 8C are views schematically showing the growth of a nuclei if an incubation time Tinc is short, respectively.
Figure 8B:
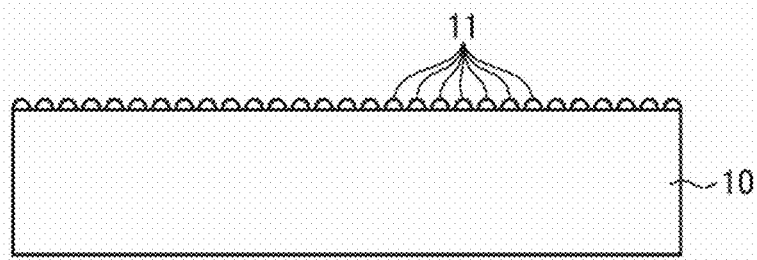
Figure 8C:
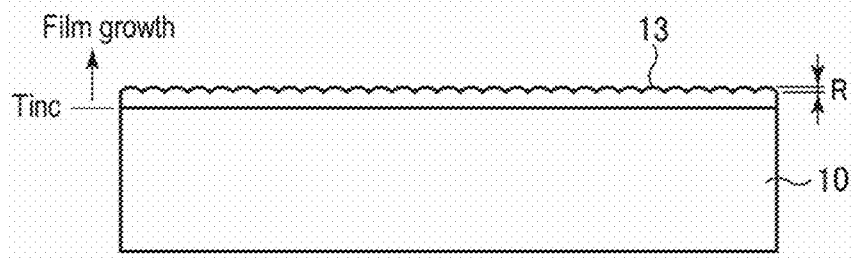

When the incubation time Tinc is relatively long, as shown in FIG. 7A, initial nuclei 11 are sparsely generated on an underlayer 10 so that a gap between the initial nuclei 11 is relatively wide.

Figure 7B:
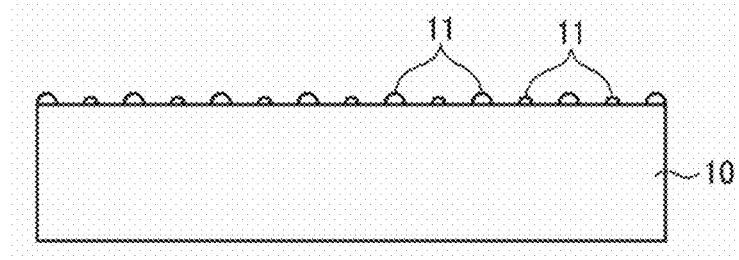
Figure 7C:
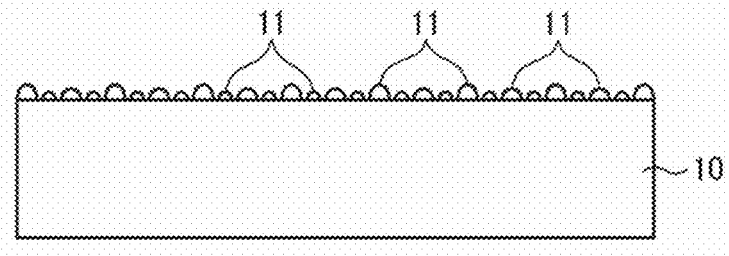
Figure 7D:
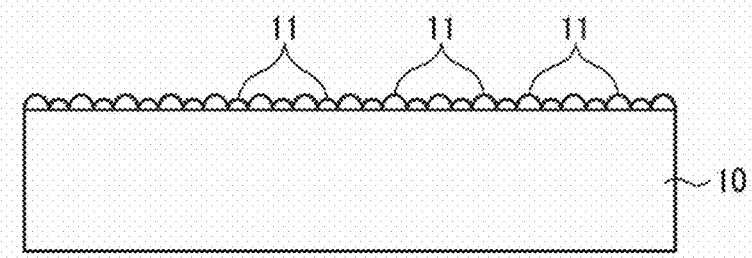
Figure 7E:
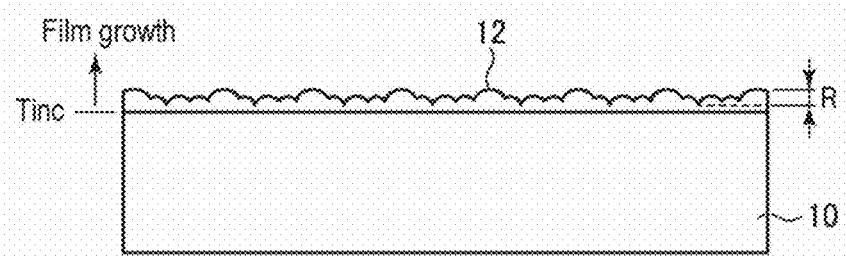

Subsequently, as shown in FIG. 7B, as time goes on, the initial nuclei 11 start to grow and subsequent nuclei 11 are generated in respective gaps. As shown in FIGS. 7C to 7D, the growth of the initial nuclei 11 and the generation of the subsequent (further subsequent) nuclei 11 are repeated so that the initial nuclei 11 and the subsequent (further subsequent) nuclei 11 are combined with each other. Finally, as shown in FIG. 7E, a film 12 as a single layer is formed on the underlayer 10. The film 12 begins to undergo a growth. A time at which the growth of the film 12 begins refers to the aforementioned incubation time Tinc.

However, during the relatively long incubation time Tinc, the growth of the initial nuclei 11 and the generation of the subsequent (further subsequent) nuclei 11 are repeated until the film 12 begins to undergo the growth. Further, a difference in a time between when the initial nuclei 11 are generated and a time when final nuclei 11 are generated is large, which increases a deviation in the size of the nuclei 11. This may result in an increased surface roughness.

<For Relatively Short Incubation Time Tinc>

Meanwhile, when the incubation time Tinc is relatively short, as shown in FIG. 8A, initial nuclei 11 are densely generated on the underlayer 10. Thus, a gap between the initial nuclei 11 is relatively narrow.

As shown in FIG. 8B, the generated initial nuclei 11 begins to grow as the time goes on. As shown in FIG. 8C, a film 13 as a single layer is formed on the underlayer 10 in a short period of time compared to the case where the incubation time Tinc is relatively long. Subsequently, the film 12 begins to undergo the growth. For the relatively short incubation time Tinc, the number of repetitions of the growth of the initial nuclei 11 and the generation of subsequent nuclei 11 is reduced, and also, a difference in a time when the initial nuclei 11 are generated and a time when final nuclei 11 are generated is reduced. This further reduces a deviation in the size of the nuclei 11. Thus, it is possible to further reduce the surface roughness compared to the case where the incubation time Tinc is relatively long.

Fourth Embodiment

In view of the foregoing, in a fourth embodiment, an underlayer of the Ge film 5 is changed into the high-order silane seed layer (Si layer) 4 so as to shorten the incubation time. A film forming process for this embodiment is performed according to a sequence described below.

FIG. 9 is a flowchart showing a sequence of a germanium film forming method according to the fourth embodiment of the present disclosure. FIGS. 10A to 10E are cross-sectional views schematically showing a state of a target object in the sequence of FIG. 9.

Figure 10A:
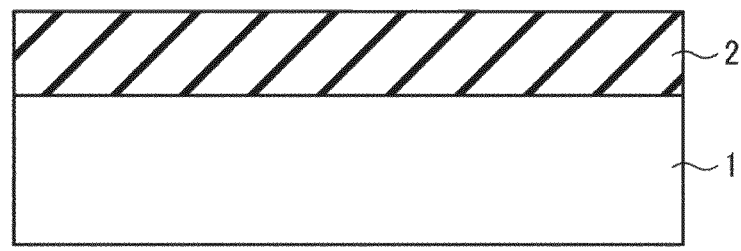
FIGS. 10A to 10E are cross-sectional views schematically showing states of a target object in the sequence of FIG. 9, respectively.

First, as shown in FIG. 10A, for example, the $SiO_2$ film 2 is formed on the wafer 1. The target object obtained by forming the $SiO_2$ film 2 on the wafer 1 is loaded into the processing chamber of the film forming apparatus.

Figure 10B:
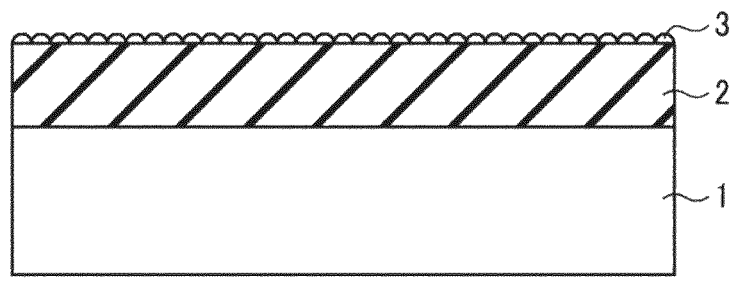
Figure 10C:
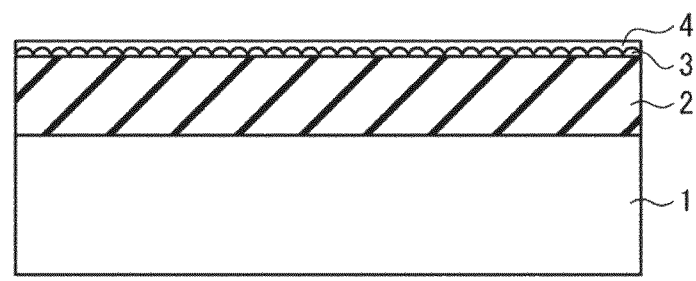
Figure 10D:
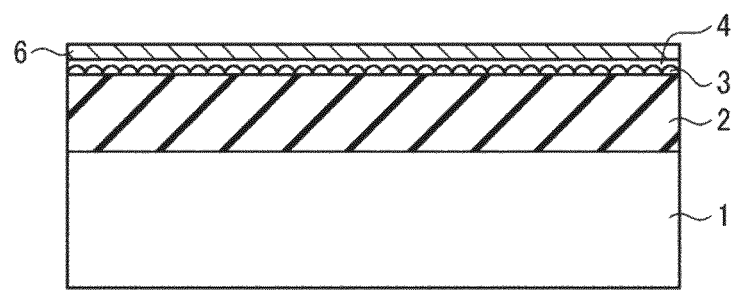
Figure 10E:
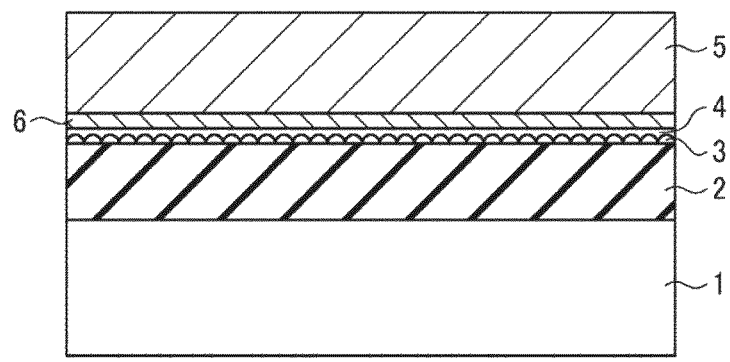

Subsequently, as shown in step S1 of FIG. 9 and FIG. 10B, an aminosilane-based gas is supplied into the processing chamber with the wafer 1 loaded thereinto. Thus, the aminosilane seed layer 3 is formed on the $SiO_2$ film 2 used as a surface to be processed. Specifically, the wafer 1 is heated and the aminosilane-based gas flows over the surface of the $SiO_2$ film 2 such that a component containing at least silicon (Si) included in the aminosilane-based gas is adsorbed onto the surface of the $SiO_2$ film 2. In this way, the aminosilane seed layer 3 is formed on the $SiO_2$ film 2, in an atomic layer level, e.g., a level of a single atom layer (on the order of monoatomic layer).

Examples of the aminosilane-based gas may include a gas containing at least one of:
BAS (butylaminosilane),
BTBAS (bis(tertiarybutylamino)silane),
DMAS (dimethylaminosilane),
BDMAS (bis(dimethylamino)silane),
TDMAS (tris(dimethylamino)silane),
DEAS (diethylaminosilane),
BDEAS (bis(diethylamino)silane),
DPAS (dipropylaminosilane), and
DIPAS (diisopropylaminosilane).
In this embodiment, DIPAS was used.

An example of a process condition applied in Step S1 is as follows:

Flow rate of DIPAS: 200 sccm
Process time: 1 minute
Process temperature: 400 degrees C.
Process pressure: 133.3 Pa (1 Torr)
(wherein, 1 Torr is defined as 133.3 Pa).

Thereafter, the inside of the processing chamber is purged and exhausted. Subsequently, as shown in Step S2 of FIG. 9 and FIG. 10C, a high-order silane-based gas of disilane or higher is supplied into the processing chamber with the wafer 1 loaded thereinto. Thus, the high-order silane seed layer (Si layer) 4 is formed on the aminosilane seed layer 3. As a specific example, the wafer 1 is heated and the high-order silane-based gas of disilane or higher flows over the surface of the aminosilane seed layer 3 such that at least silicon included in the high-order silane-based gas of disilane or higher is deposited on the aminosilane seed layer 3. In this way, the high-order silane seed layer 4 obtained by, for example the deposition of Si, is formed on the aminosilane seed layer 3.

An example of the high-order silane-based gas of disilane or higher may include a gas including at least one of:
$Si_2H_6$,
Hydride of Si represented by $Si_mH_{2m+2}$ (wherein m is a natural number of 3 or more), and
Hydride of Si represented by $Si_nH_{2n}$ (wherein n is a natural number of 3 or more).

From a practical viewpoint, the hydride of Si represented by $Si_mH_{2m+2}$ may be at least one selected from a group consisting of:
Trisilane ($Si_3H_8$),
Tetrasilane ($Si_4H_{10}$),
Pentasilane ($Si_5H_{12}$),
Hexasilane ($Si_6H_{14}$), and
Heptasilane ($Si_2H_{16}$).

Furthermore, from a practical viewpoint, the hydride of Si represented by $Si_nH_{2n}$ may be at least one selected from a group consisting of:
Cyclotrisilane ($Si_3H_6$),
Cyclotetrasilane ($Si_4H_8$),
Cyclopentasilane ($Si_5H_{10}$),
Cyclohexasilane ($Si_6H_{12}$), and
Cycloheptasilane ($Si_2H_{14}$).

In this embodiment, disilane ($Si_2H_6$) was used as the high-order silane-based gas of disilane or higher.

An example of a process condition applied in Step S2 is as follows:

Flow rate of $Si_2H_6$: 200 sccm
Process time: 4.3 minutes
Process temperature: 400 degrees C.
Process pressure: 133.3 Pa (1 Torr).

Thereafter, the inside of the processing chamber is purged and exhausted. Subsequently, as shown in Step S3 of FIG. 9 and FIG. 10D, a Si source gas and a Ge source gas are supplied into the processing chamber with the wafer 1 loaded thereinto. Thus, a Ge-rich SiGe buffer layer 6 is formed on the high-order silane seed layer 4. As a specific example, the wafer 1 is heated and both the Si source gas and the Ge source gas flow over a surface of the high-order silane seed layer 4 such that Si included in the Si source gas and Ge included in the Ge source gas are deposited on the surface of the high-order silane seed layer 4. In this way, the Ge-rich SiGe buffer layer 6 is formed on the high-order silane seed layer 4.

In some embodiments, a low-order silane-based gas, which has lower order than the high-order silane-based gas used in Step S2, may be used as the Si source gas in Step S3. The reason for this is that the low-order silane-based gas has a film formation rate slower than that of the high-order silane-based gas, but has a good surface roughness and a good step coverage in a formed film. In this embodiment, since disilane ($Si_2H_6$) was used in Step S2, monosilane ($SiH_4$) was used as the Si source gas in Step S3. However, the present disclosure is not limited thereto. Alternatively, when trisilane ($Si_3H_8$) was used in Step S2, disilane ($Si_2H_6$) may be used as the Si source gas in Step S3.

Furthermore, while mono-germane ($GeH_4$) was used as the Ge source gas used in Step S3, the present disclosure is not limited thereto. In some embodiments, a high-order gemane-based gas such as digemane ($Ge_2H_6$) may be used as the Ge source gas in Step S3.

An example of a process condition applied in Step S3 is as follows:
Flow rate of $SiH_4$: 75 sccm
Flow rate of $GeH_4$: 300 sccm
Process time: 7.2 minutes
Process temperature: 400 degrees C.
Process pressure: 199.95 Pa (1.5 Torr).

Under such a process condition, the Ge-rich SiGe buffer layer 6 which has, e.g., a thickness of about 10 nm and a composition ratio of Si:Ge=30%:70%, is formed. The reason why the Ge-rich SiGe buffer layer 6 having such a composition ratio is selected is to obtain the relatively small surface roughness Rms on the order of 0.272 nm, as also shown in FIG. 2. In this embodiment, a target value of the surface roughness Rms of the Ge film 5 that is formed on the Ge-rich SiGe buffer layer 6 is set to fall within a range of 0.272 nm≤Rms≤1 nm. As such, the Ge-rich SiGe buffer layer 6 having the same surface roughness Rms as the target value was selected as the underlayer of the Ge film 5.

Further, the composition ratio of Si:Ge in the Ge-rich SiGe buffer layer 6 is not limited to 30%:70%. As an example, the composition ratio of Si:Ge in the Ge-rich SiGe buffer layer 6 may be set such that a Ge concentration of the Ge-rich SiGe buffer layer 6 is lower than that of Ge in the Ge film 5. In some embodiments, the Ge concentration of the Ge-rich SiGe buffer layer 6 may be set to fall within a range from 60% or more to less than 80%. The reason why the Ge concentration is set to less than 80% is as follows. The Ge concentration of the Ge film 5 is sometimes set to fall within a range from 80% or more 100% or less such that the Ge film 5 is used as a channel material. To support this, the Ge concentration of the Ge-rich SiGe buffer layer 6 is suppressed to be lower than the concentration of Ge in the Ge film 5. In some embodiments, the Ge concentration of the Ge-rich SiGe buffer layer 6 may be set to fall within a range from 60% or more to 70% or less. The reason for this is to suppress the target value of the surface roughness Rms of the Ge film 5 to, e.g., 0.272 nm or less.

Thereafter, the inside of the processing chamber is purged and exhausted. Subsequently, as shown in Step S4 of FIG. 9 and FIG. 10E, a Ge source gas is supplied into the processing chamber with the wafer 1 loaded thereinto. Thus, the Ge film 5 is formed on the Ge-rich SiGe buffer layer 6. As a specific example, the wafer 1 is heated and the Ge source gas flows over a surface of the Ge-rich SiGe buffer layer 6 such that at least Ge included in the Ge source gas is deposited on the surface of the Ge-rich SiGe buffer layer 6. In this way, the Ge film 5 obtained by the deposition of Ge is formed on the Ge-rich SiGe buffer layer 6. In this embodiment, since the Si source gas was not used in Step S4, the Ge concentration of the Ge film 5 is almost 100%.

The same Ge source gas as that used in Step S3 may be used as the Ge source gas used in Step S4. In this embodiment, monogemane was used.

Furthermore, a film formation temperature in Step S4 is set to fall within a range from a temperature or higher at which the Ge source gas is thermally decomposed to 300 degrees C. or less, so as to suppress the crystallization of the Ge film 5, as described in the first embodiment. In this embodiment, the film formation temperature of the Ge film 5 was set to 300 degrees C.

An example of a process condition applied in Step S4 is as follows:
Flow rate of $GeH_4$: 700 sccm
Process time: 50 minutes
Process temperature: 300 degrees C.
Process pressure: 199.95 Pa (1.5 Torr).

<Incubation Time>

Figure 11:
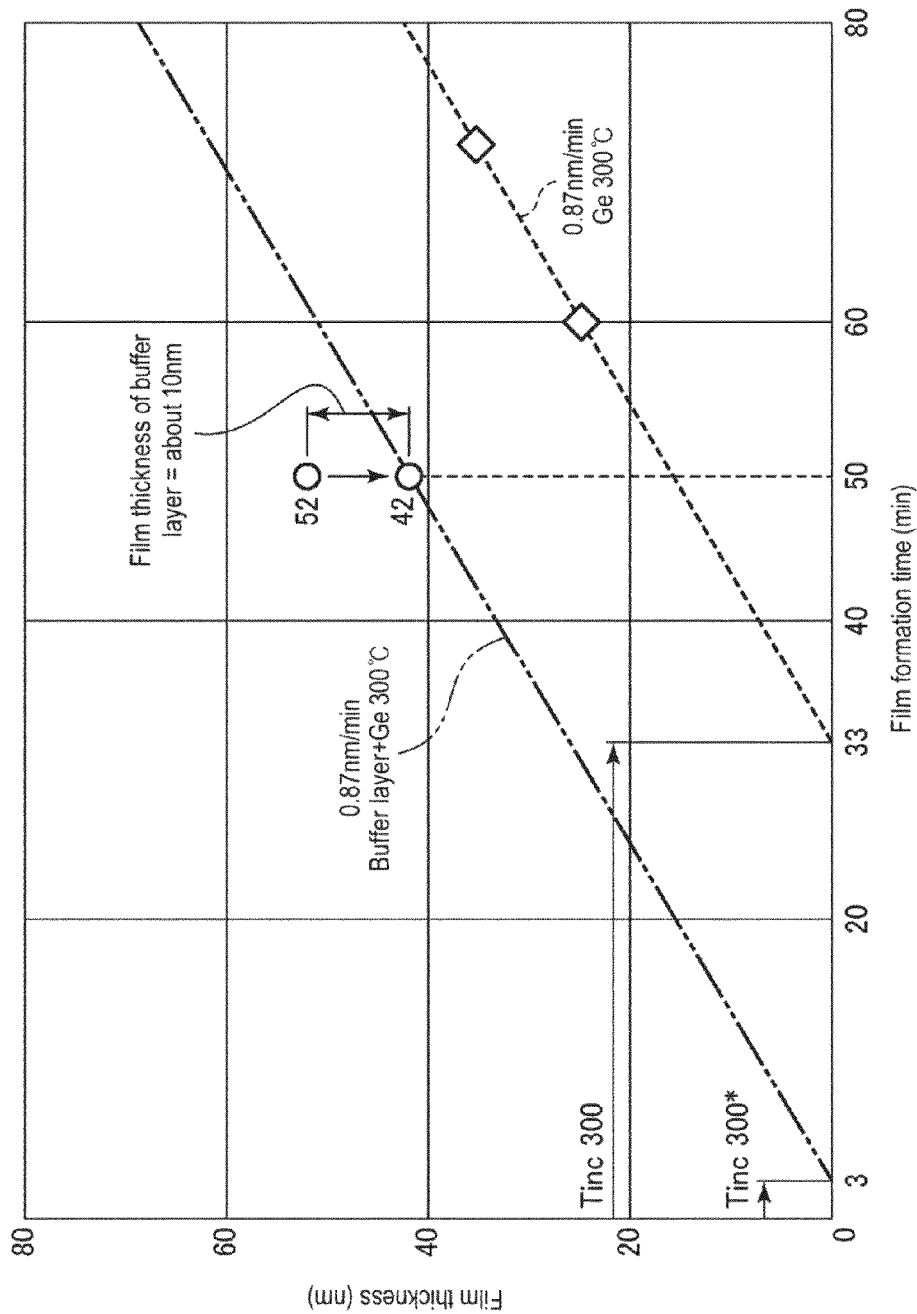
FIG. 11 is a view showing a relationship between a film formation time and a film thickness when a Ge film is formed on Si and a buffer layer.

FIG. 11 is a view showing a relationship between a film formation time and a film thickness of the Ge film 5 when the Ge film 5 is formed on each of the high-order silane seed layer 4 and the Ge-rich SiGe buffer layer 6.

As shown in FIG. 11, when the Ge film 5 was formed on the high-order silane seed layer 4 using the film forming method according to the first embodiment, the incubation time Tinc 300 of the Ge film-300 degrees C. was about 33 minutes (see FIG. 6). Meanwhile, when the Ge film 5 was formed on the Ge-rich SiGe buffer layer 6 having the composition ratio of Si 30%:Ge 70% using the film forming method according to the fourth embodiment, an incubation time Tinc 300* of the Ge film-300 degrees C. was about 3 minutes. The incubation time Tinc 300* was calculated by the following manner.

At the film formation time of 50 minutes, the total film thickness of the Ge film 5 and the Ge-rich SiGe buffer layer 6 was about 52 nm. In this case, the film thickness of the Ge film 5 was about 42 nm, which is driven by subtracting the film thickness (i.e., 10 nm) of the Ge-rich SiGe buffer layer 6 from the total film thickness of about 52 nm. The process condition applied when forming the Ge film 5 in the fourth embodiment is the same as that of the first embodiment. Thus, the film formation rate of the Ge film 5 was 0.87 nm/min that is identical with that in the first embodiment. The incubation time Tinc 300" is calculated by drawing a straight line from an intersection point of the film formation time of 50 minutes with the film thickness of about 42 nm toward a point at which the film thickness becomes 0 nm, at a gradient of 0.87.

As described above, according to the fourth embodiment in which the Ge-rich SiGe buffer layer 6 followed by the Ge film 5 is formed on the high-order silane seed layer 4, it is possible to shorten the incubation time Tinc of the Ge film 5 compared to the first and third embodiments in which the Ge-rich SiGe buffer layer 6 is not formed.

<Monitoring of Surface of Ge Film 5>

Figure 12:
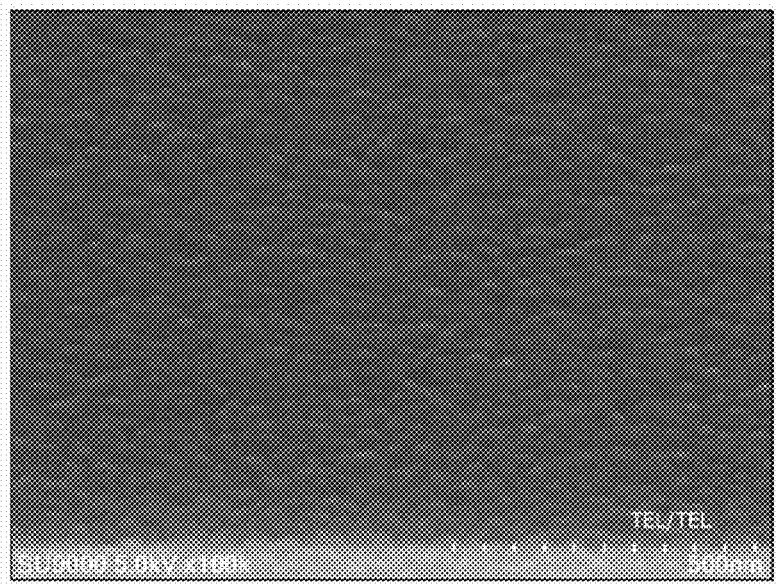
FIGS. 12 to 14 are drawing substitute photographs obtained by imaging a surface of a Ge film, respectively.
Figure 13:
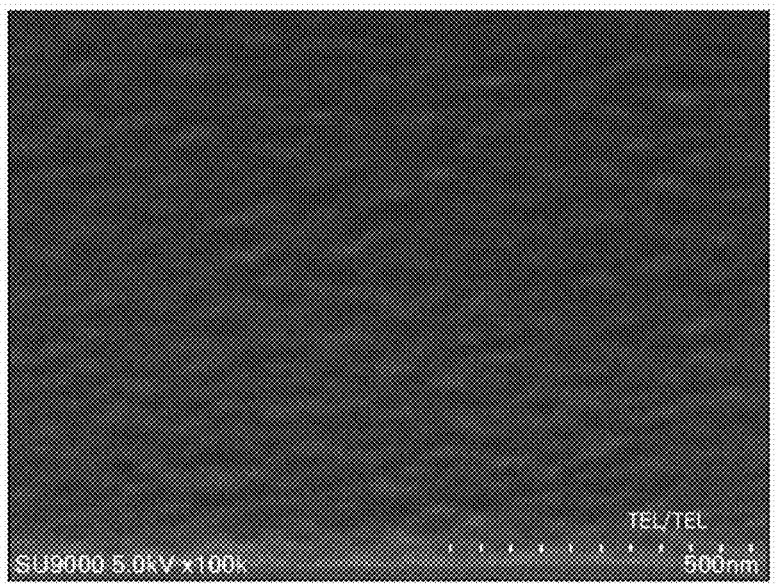
Figure 14:
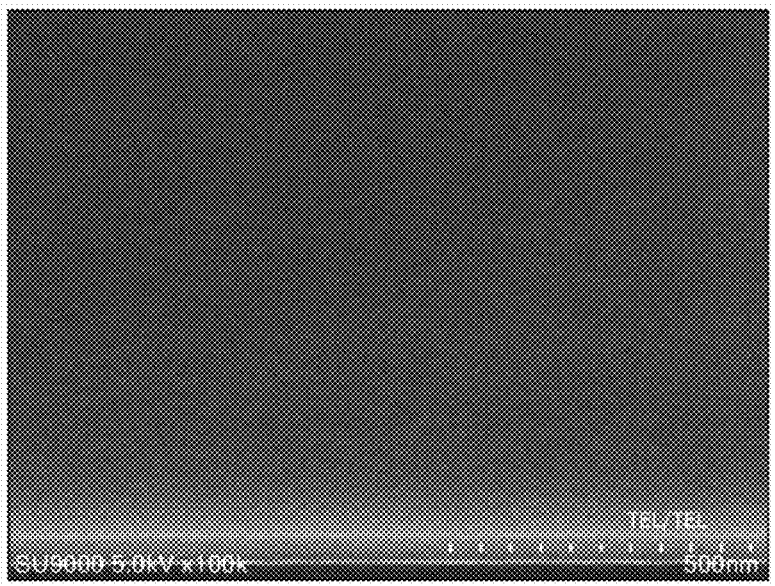

FIGS. 12 to 14 are drawing substitute photographs obtained by imaging a surface of the Ge film 5, respectively. Specifically, FIG. 12 is a photograph of the surface of the Ge film 5 which is formed using the film forming method according to the first embodiment. FIG. 13 is a photograph of the surface of the Ge film 5 which is formed using the film forming method according to the second embodiment. FIG. 14 is a photograph of the surface of the Ge film 5 which is formed using the film forming method according to the third embodiment.

As shown in FIG. 12, irregularities were definitely observed on the surface of the Ge film 5 formed at the film formation temperature of 300 degrees C. in the first embodiment. At this time, the surface roughness Rms was 1.47 nm.

As shown in FIG. 13, compared to the first embodiment, relatively smoothed irregularities were observed on the surface of the Ge film 5 formed at the film formation temperature of 275 degrees C. in the second embodiment. At this time, the surface roughness Rms was 0.89 nm.

As shown in FIG. 14, it was difficult to definitely observe irregularities on the surface of the Ge film 5 formed at the film formation temperature of 300 degrees C. in the third embodiment. From the state of this surface, it is considered that the surface roughness Rms is changed from less than 0.89 nm close to 0.272 nm which is the surface roughness Rms of the Ge-rich SiGe film 6 having the composition ratio of Si:Ge=30%:70%, which is formed at a film formation temperature of 400 degrees C.

As described above, according to the third embodiment, the surface roughness Rms can be further reduced compared to the first and second embodiments. That is to say, it is possible to obtain the Ge film 5 having the surface roughness Rms=0.272 nm obtained at the film formation temperature of 400 degrees C. and the Ge concentration of 70%, or one smaller than 0.272 nm.

The Ge film 5 having such a small surface roughness has higher carrier mobility than the Si underlayer, thus being of considerable use as a channel material for a next-generation transistor.

Furthermore, the third embodiment does not deny the first and second embodiments. As an example, the Ge films according to the first and second embodiments can be usefully used as the channel material as long as the surface roughness Rms falls within a range from 1.47 nm to 0.89 nm.

FIG. 15 is a timing chart showing a sequence of timings at which the supply of gases, and the purge-exhaust operation are performed in an example of the Ge film forming method according to the fourth embodiment of the present disclosure.

As shown in FIG. 15, in Step S1, the aminosilane-based gas is supplied into the processing chamber of the film forming apparatus. Thereafter, the inside of the processing chamber is purged by an inert gas (e.g., nitrogen ($N_2$) gas) supplied thereinto, and then exhausted (in a purge-exhaust operation).

Subsequently, in Step S2, the high-order silane-based gas of disilane or higher is supplied into the processing chamber. Thereafter, the inside of the processing chamber is purged and exhausted.

Subsequently, in Step S3, the low-order silane-based gas used as the Si source gas and the Ge source gas are supplied into the processing chamber. Thereafter, the inside of the processing chamber is purged and exhausted.

Subsequently, in Step S4, the Ge source gas is supplied into the processing chamber. Thereafter, the inside of the processing chamber is purged and exhausted (not shown).

As described above, in the fourth embodiment, the purge-exhaust operation is performed between Steps S1 to S4 such that each of Steps S1 to S4 is independently performed.

In some embodiments, for example, Step S3 and Step S4 may be performed without performing the purge-exhaust operation therebetween (which will be described later).

FIG. 16 is a timing chart showing a sequence of timings at which the supply of gases, and a purge-exhaust operation are performed in an example of a Ge film forming method according to another embodiment of the present disclosure.

As shown in FIG. 16, in another embodiment, in Step S3, the amount of supply of the low-order silane-based gas is gradually reduced, and finally becomes "zero." On the contrary, the amount of supply of the Ge source gas is gradually increased, and finally becomes the same as that set in Step S4.

Fifth Embodiment

FIG. 17 is a cross-sectional view of a wafer having a Ge film formed thereon, the Ge film being formed by a Ge film forming method according to a fifth embodiment of the present disclosure.

As shown in FIG. 17, in the Ge film 5 formed according to the fifth embodiment, a transitive Ge-rich SiGe buffer layer 6a in which an Si concentration and a Ge concentration are consecutively changed, and finally, are reversed, is formed on the high-order silane seed layer 4. The Ge film 5 is formed on the transitive Ge-rich SiGe buffer layer 6a thus formed.

FIG. 18A is a view showing a concentration profile in depth direction of the wafer 1 having the Ge film 5 formed according to the fifth embodiment of the present disclosure.

As shown in FIG. 18A, a region in which the Ge concentration is almost 100% and the Si concentration is almost 0% in a depth direction in a surface of the Ge film 5 refers to the region of the Ge film 5. Subsequently, as the concentration progresses in the depth direction, a region in which the Ge concentration is transitioned from almost 100% to almost 0% while the Si concentration is transitioned from almost 0% to almost 100%, refers to the region of the transitive Ge-rich SiGe buffer layer 6a. Subsequently, as the concentration further progresses in the depth direction, a region in which the Ge concentration becomes almost 0% and the Si concentration becomes almost 100% refers to the region of the high-order silane seed layer 4 or the aminosilane seed layer 3. A region under the aminosilane seed layer 3 is omitted in FIG. 18A.

As described above, the transitive Ge-rich SiGe buffer layer 6a in which the Si concentration and the Ge concentration are consecutively transitioned is formed under the Ge film 5 formed in the fifth embodiment. According to the fifth embodiment, like the fourth embodiment, the transitive Ge-rich SiGe buffer layer 6a is formed under the Ge film 5, thus further reducing the surface roughness Rms compared to the first and second embodiments. Therefore, it is possible to obtain the Ge film 5 having the surface roughness Rms=0.272 nm obtained at the film formation temperature of 400 degrees C. and the Ge concentration of 70%, or one smaller than 0.272 nm.

For reference, FIG. 18B shows a concentration profile of the wafer 1 on which the Ge film 5 formed in the fourth embodiment is formed, in the depth direction.

As shown in FIG. 18B, the Ge-rich SiGe buffer layer 6 in which the Si concentration is controlled to 30% and the Ge concentration is controlled to 70%, is formed under the Ge film 5 formed in the fourth embodiment.

Sixth Embodiment

This embodiment relates to an example of the film forming apparatus which is capable of performing the Ge film forming methods according to the first to fifth embodiments.

FIG. 19 is a cross-sectional view schematically showing the example of the film forming apparatus which is capable of performing the Ge film forming methods according to the first to fifth embodiments.

As shown in FIG. 19, the film forming apparatus 100 includes a cylindrical processing chamber 101 having a ceiling with a bottom end opened. The entirety of the processing chamber 101 is formed of, e.g., quartz. A quartz ceiling plate 102 is located at the ceiling inside the processing chamber 101. A manifold 103, which is formed of, e.g., a stainless steel to have a cylindrical shape, is connected to a lower end opening portion of the processing chamber 101 through a sealing member 104 such as an O-ring.

The manifold 103 supports a lower end of the processing chamber 101. A wafer boat 105 of quartz, into which a plurality of (e.g., 50 to 100) semiconductor wafers (in this embodiment, the silicon wafers 1) can be loaded as target objects in multiple stages, is insertable into the processing chamber 101 through a lower portion of the manifold 103. The wafer boat 105 includes a plurality of supporting pillars 106, and the plurality of wafers 1 are supported by grooves (not shown) which are formed in each of the supporting pillars 106.

The wafer boat 105 is loaded on a table 108 with a heat insulating tube 107 of quartz interposed between the wafer boat 105 and the table 108. The table 108 is supported on a rotation shaft 110 that passes through a cover part 109. The cover part 109 is made of, e.g., a stainless steel, and opens or closes a lower end opening portion of the manifold 103. A magnetic fluid seal 111 is disposed at a through portion of the rotation shaft 110. The magnetic fluid seal 111 closely seals and rotatably supports the rotation shaft 110. Also, for example, a seal member 112 such as an O-ring is disposed between a periphery of the cover part 109 and a lower end portion of the manifold 103, thus maintaining sealability in the processing chamber 101. The rotation shaft 110 is disposed at a front end of an arm 113 that is supported by, e.g., an ascending/descending instrument such as a boat elevator. Thus, the wafer boat 105 and the cover part 109 are elevated in an integrated manner to be inserted into/separated from the processing chamber 101.

The film forming apparatus 100 includes a process gas supply mechanism 114 configured to supply a process gas into the processing chamber 101 and an inert gas supply mechanism 115 configured to supply an inert gas into the processing chamber 101.

The process gas supply mechanism 114 includes an aminosilane-based gas supply source 117a, a high-order silane-based gas supply source 117b configured to supply a high-order silane-based gas of disilane or higher, a low-order silane-based gas supply source 117c, and a Ge source gas supply source 117d. In this embodiment, DIPAS was used as the aminosilane-based gas, disilane was used as the high-order silane-based gas, monosilane was used as the low-order silane-based gas, and mono-germane was used as the Ge source gas.

The inert gas supply mechanism 115 includes an inert gas supply source 120. The inert gas is used as a purge gas. In this embodiment, nitrogen was used as the inert gas.

The aminosilane-based gas supply source 117a is coupled to a dispersion nozzle 123a through a flow rate controller 121a and an on-off valve 122a. Likewise, the high-order silane-based gas supply source 117b is coupled to a dispersion nozzle 123b (not shown) through a flow rate controller 121b and an on-off valve 122b. The low-order silane-based gas supply source 117c is coupled to a dispersion nozzle 123c (not shown) through a flow rate controller 121c and an on-off valve 122c. The Ge source gas supply source 117d is coupled to a dispersion nozzle 123d through a flow rate controller 121d and an on-off valve 122d.

The dispersion nozzles 123a to 123d, which are made of quartz tubes, are configured to penetrate through the sidewall of the manifold 103 inward, bend upward, and extend vertically. A plurality of gas discharge holes 124a to 124d is formed at a predetermined interval in a vertical portion of each of the dispersion nozzles 123a to 123d. Each of the aminosilane-based gas, the high-order silane-based gas of disilane or higher, the low-order silane-based gas, and the Ge source gas is approximately uniformly discharged from the respective gas discharge holes 124a to 124d into the inside of the processing chamber 101 in the horizontal direction.

The inert gas supply source 120 is connected to a nozzle 128 through a flow rate controller 121e and an on-off valve 122e. The nozzle 128 penetrates the sidewall of the manifold 103 and discharges the inert gas from the front end of the nozzle to the inside of the processing chamber 101 in the horizontal direction.

At a portion opposite to the dispersing nozzles 123a to 123d in the processing chamber 101, an exhaust vent 129 is formed to exhaust the processing chamber 101. The exhaust vent 129 has an elongated shape formed by chipping the sidewall of the processing chamber 101 in the vertical direction. At a portion corresponding to the exhaust vent 129 of the processing chamber 101, an exhaust vent cover member 130 with a C-shaped section is installed by welding to cover the exhaust vent 129. The exhaust vent cover member 130 extends upward along the sidewall of the processing chamber 101, and defines a gas outlet 131 at the top of the processing chamber 101. An exhaust mechanism 132 including a vacuum pump is connected to the gas outlet 131. The exhaust mechanism 132 exhausts the processing chamber 101 to discharge the process gas used for the process and to change an internal pressure of the processing chamber 101 into a process pressure.

A cylindrical heating device 133 is installed on the outer periphery of the processing chamber 101. The heating device 133 activates a gas supplied into the processing chamber 101 and heats the target objects (the wafers 1 in this embodiment) loaded into the processing chamber 101.

For example, respective components of the film forming apparatus 100 are controlled by a controller 150 including a microprocessor (e.g., a computer). The controller 150 is connected to a user interface 151 including an input unit including a touch panel display or a keyboard for inputting, by an operator, a command to manage the film forming apparatus 100, and a display unit for visually displaying an operation state of the film forming apparatus 100.

A memory part 152 is connected to the controller 150. The memory part 152 stores a control program for executing various processes in the film forming apparatus 100 under the control of the controller 150, and a program (i.e., a recipe) for executing a process in a respective component of the film forming apparatus 100 according to the process conditions. For example, the recipe is stored in a memory medium of the memory part 152. The memory medium may include a hard disk, a semiconductor memory, a CD-ROM, a DVD, and a portable memory such as a flash memory. The recipe may be suitably transmitted from other device through a dedicated line. If necessary, the recipe is read from the memory part 152 in response to a command received from the user interface 151, and the controller 150 executes a process according to the read recipe. Accordingly, the film forming apparatus 100 performs a desired process under the control of the controller 150.

In this embodiment, the Ge film forming methods according to the first to fifth embodiments are performed under the control of the controller 150. As described above, the Ge film forming methods according to the first to fifth embodiments may be performed by the film forming apparatus 100 shown in FIG. 19.

While certain embodiments of the present disclosure have been described, the present disclosure is not limited to these embodiments and may be modified in various ways.

For example, although specific process conditions are illustrated in the above embodiments, the process conditions are not limited thereto. The process conditions may be changed depending on a volume of a processing chamber in which target objects are accommodated, a change in process pressure, or the like.

While the SiO$_2$ film 2 has been described to be used as an underlayer on which the Ge film 5 is formed, the present disclosure is not limited thereto. As an example, a SiNi film, a titanium nitride film, a carbon film, or a metal film may be used as the underlayer.

In some embodiments, the process condition applied when forming the aminosilane seed layer 3 and the high-order silane seed layer 4 in the first and second embodiments may be the same as the process condition applied when forming the aminosilane seed layer 3 and the high-order silane seed layer 4 in the third embodiment.

Furthermore, by further forming the high-order silane seed layer 4 on the aminosilane seed layer 3, it is possible to improve an in-plane uniformity of a film thickness of the formed Ge film 5 compared to the case where the Ge film 5 is directly formed on the aminosilane seed layer 3.

Furthermore, the aminosilane-based gas is not limited to a gas having one silicon (Si) in a molecular formula. As an example, a high-order aminosilane-based gas such as a gas having two silicones in the molecular formula, e.g., a hexakis(ethyl amino)disilane (C$_{12}$H$_{36}$N$_6$Si$_2$) gas, may also be used as the aminosilane-based gas.

Furthermore, in addition to the hexakis(ethyl amino) disilane gas, examples of the high-order aminosilane-based gas may be a gas including a silicon amino compound represented by the following formulas:

(A), or

(B)

wherein n is a number from 1 to 6, indicating the number of amino groups, m is a number from 0 to 5, indicating the number of alkyl groups, R1, R2 and R3 are each independently selected from a group consisting of CH$_3$, C$_2$H$_5$ and C$_3$H$_7$, R3 may be Cl, and X is a number equal to or greater than 2.

Furthermore, a gas including at least one type of the silicon amino compound represented by the formulas (A) and (B) may be selected as the process gas used in Step S1.

Examples of the high-order aminosilane-based gas represented by the formula (A) may include:

Diisopropylaminodisilane (Si$_2$H$_5$N(iPr)$_2$),
Diisopropylaminotrisilane (Si$_3$H$_7$N(iPr)$_2$),
Diisopropylaminochlorodisilane (Si$_2$H$_4$ClN(iPr)$_2$),
Diisopropylaminochlorotrisilane (Si$_3$H$_6$ClN(iPr)$_2$), or the like.

At least one of these gases may be selected as the process gas.

Furthermore, examples of the high-order aminosilane-based gas represented by the formula (B) may include:

Diisopropylaminocyclotrisilane (Si$_3$H$_5$N(iPr)$_2$),
Diisopropylaminochlorocyclotrisilane (Si$_3$H$_4$ClN(iPr)$_2$), or the like.

At least one of these gases may be selected as the process gas.

By using the high-order aminosilane-based gas with respect to the aminosilane seed layer 3, it is possible to suppress pin holes from being generated in the Ge film 5 even if a film thickness of the Ge film 5 is thin, compared to a case where the low-order aminosilane-based gas is used with respect to the aminosilane seed layer 3.

According to some embodiments of the present disclosure, it is possible to provide a germanium film forming method, which is capable of forming a Ge-rich SiGe film or a Ge film containing Ge of a high concentration, on a surface of a target object with a good surface roughness, and a film forming apparatus capable of implementing the film forming method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a germanium (Ge) film on a surface of a target object, comprising:
   supplying an aminosilane-based gas into a processing chamber in which the target object is loaded to form an aminosilane seed layer on the surface of the target object;
   supplying a high-order silane-based gas of disilane or higher into the processing chamber to form a high-order silane seed layer on the aminosilane seed layer; and
   supplying a Ge source gas into the processing chamber to form the Ge film on the high-order silane seed layer,
   wherein a process temperature in supplying the Ge source gas is set to fall within a range from a temperature, at which the Ge source gas is thermally decomposed or higher, to 300 degrees C. or less.

2. The method of claim 1, wherein the process temperature in the supplying a Ge source gas is set to fall within a range from a temperature, at which the Ge source gas is thermally decomposed or higher, to 275 degrees C. or less.

3. The method of claim 1, wherein a Ge concentration of the Ge thin film is controlled to fall within a range from more than 70% to 100% or less.

4. The method of claim 1, wherein a Ge concentration of the Ge film is controlled to fall within a range from more than 80% to 100% or less.

5. A method of forming a Germanium (Ge) film on a surface of a target object, comprising:
   supplying an aminosilane-based gas into a processing chamber in which the target object is loaded to form an aminosilane seed layer on the surface of the target object;
   supplying a high-order silane-based gas of disilane or higher into the processing chamber to form a high-order silane seed layer on the aminosilane seed layer;
   supplying a silicon (Si) source gas and a Ge source gas into the processing chamber to form a Ge-rich SiGe buffer layer on the high-order silane seed layer; and
   supplying the Ge source gas into the processing chamber to form the Ge film on the Ge-rich SiGe buffer layer.

6. The method of claim 5, wherein a Ge concentration of the Ge-rich SiGe buffer layer is controlled to fall within a range from more than 60% to less than 80%.

7. The method of claim 5, wherein a Ge concentration of the Ge-rich SiGe buffer layer is controlled to fall within a range from 60% or more to 70% or less.

8. The method of claim 5, wherein a process temperature in supplying the Ge source gas is set to fall within a range from a temperature or higher at which the Ge source gas is thermally decomposed to 300 degrees C. or less.

9. The method of claim 5, wherein a process temperature in supplying the Ge source gas is set to fall within a range from a temperature or higher at which the Ge source gas is thermally decomposed to 275 degrees C. or less.

10. The method of claim 5, wherein a Ge concentration of the Ge film is controlled to fall within a range from more than 70% to 100% or less.

11. The method of claim 5, wherein a Ge concentration of the Ge film is controlled to fall within a range from 80% or more to 100% or less.

12. The method of claim 1, wherein the aminosilane-based gas is one selected from a group consisting of:
BAS (butylaminosilane),
BTBAS (bis(tertiarybutylamino)silane),
DMAS (dimethylaminosilane),
BDMAS (bis(dimethylamino)silane),
TDMAS (tris(dimethylamino)silane),
DEAS (diethylaminosilane),
BDEAS (bis(diethylamino)silane),
DPAS (dipropylaminosilane),
DIPAS (diisopropyl aminosilane), $$((R1R2)N)_n Si_X H_{2X+2-n-m}(R3)_m \quad (A), \text{ and}$$

$$((R1R2)N)_n Si_X H_{2X-n-m}(R3)_m \quad (B),$$

wherein in the formulas (A) and the (B),
n is a number from 1 to 6, indicating the number of amino groups,
m is a number from 0 to 5, indicating the number of alkyl groups,
R1, R2 and R3 are each independently selected from a group consisting of $CH_3$, $C_2H_5$ and $C_3H_7$, and
X is a number equal to or greater than 2.

13. The method of claim 1, wherein the high-order silane-based gas of disilane or higher is at least one selected from a group consisting of:
$Si_2H_6$,
Hydride of Si represented by $Si_mH_{2m+2}$ (wherein m is a natural number of 3 or more), and
Hydride of Si represented by $Si_nH_{2n}$ (wherein n is a natural number of 3 or more).

14. The method of claim 13, wherein the hydride of Si represented by $Si_mH_{2m+2}$ is at least one selected from a group consisting of:
Trisilane ($Si_3H_8$),
Tetrasilane ($Si_4H_{10}$),
Pentasilane ($Si_5H_{12}$),
Hexasilane ($Si_6H_{14}$), and
Heptasilane ($Si_7H_{16}$), and
wherein the hydride of Si represented by $Si_nH_{2n}$ is at least one selected from a group consisting of:
Cyclotrisilane ($Si_3H_6$),
Cyclotetrasilane ($Si_4H_8$),
Cyclopentasilane ($Si_5H_{10}$),
Cyclohexasilane ($Si_6H_{12}$), and
Cycloheptasilane ($Si_7H_{14}$).

* * * * *